(12) United States Patent
Nagashima et al.

(10) Patent No.: US 9,056,596 B2
(45) Date of Patent: Jun. 16, 2015

(54) ELECTRONIC CONTROL UNIT

(75) Inventors: Kazuaki Nagashima, Kiryu (JP); Ryota Takagi, Isesaki (JP); Susumu Kaneko, Isesaki (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 417 days.

(21) Appl. No.: 13/446,086

(22) Filed: Apr. 13, 2012

(65) Prior Publication Data

US 2013/0033098 A1 Feb. 7, 2013

(30) Foreign Application Priority Data

Aug. 4, 2011 (JP) ................... 2011-170613
Aug. 4, 2011 (JP) ................... 2011-170614

(51) Int. Cl.
*B60T 7/04* (2006.01)
*B60T 8/36* (2006.01)
*H01R 4/48* (2006.01)
*H05K 5/00* (2006.01)
*H05K 9/00* (2006.01)

(52) U.S. Cl.
CPC ............... *B60T 7/042* (2013.01); *B60T 8/3675* (2013.01); *H01R 4/48* (2013.01); *H05K 5/0065* (2013.01); *H05K 9/0015* (2013.01)

(58) Field of Classification Search
USPC ......... 303/DIG. 10, 119.2, 119.3; 439/95, 97, 439/84; 361/753
See application file for complete search history.

(56) References Cited

U.S. PATENT DOCUMENTS 5,608,611 A * 3/1997 Szudarek et al. ............. 361/753
5,991,164 A * 11/1999 Saito et al. .................... 361/799
6,528,915 B1 * 3/2003 Moskob ........................ 310/71
6,869,295 B2 * 3/2005 Hein et al. ...................... 439/95
7,290,840 B2 11/2007 Tsunehara et al.
7,997,665 B2 8/2011 Nakazawa
2007/0252431 A1 11/2007 Tsunooka et al.
2012/0071010 A1 3/2012 Motoda
2014/0053545 A1 * 2/2014 YAHAGI et al. ............... 60/545

FOREIGN PATENT DOCUMENTS

JP 2002042915 A * 2/2002 ............ H01R 4/64
JP 2007-290596 A 11/2007
JP 2008094334 A * 4/2008
JP 2010-111248 A 5/2010

OTHER PUBLICATIONS

English-language Abstract of JP 2002-042915.*
English-language Abstract of JP 2008-094334.*
U.S. Appl. No. 13/231,359, filed Sep. 13, 2011.

* cited by examiner

*Primary Examiner* — Nicholas J Lane
(74) *Attorney, Agent, or Firm* — Crowell & Moring LLP

(57) ABSTRACT

In an electronic control unit having a metallic control block in which a plurality of control equipments are installed, a metallic cover member fitted onto the metallic control block, and an electronic control mechanism retained between the control block and the cover member to drive the control equipments, the electronic control mechanism includes: a bus bar constituent made of a resin material and having a power electronic circuit to drive the control equipments; and a print board to control the drive of the control equipments via the bus bar constituent, the print board on which a plurality of electronic parts are mounted being fixed onto the bus bar constituent by means of a metallic fixture section and an electrically conducting section being disposed to electrically conduct the control block to the cover member to provide the same electric potential for both of the cover member and the control block.

7 Claims, 7 Drawing Sheets

ELECTRONIC CONTROL UNIT

BACKGROUND OF THE INVENTION (1) Field of the Invention

The present invention relates to an electronic control unit to control, for example, an anti-lock brake system (ABS) for a vehicle.

(2) Description of Related Art

A Japanese Patent Application First Publication (tokkai) No. 2007-290596 published on Nov. 8, 2007 (which corresponds to a United States Patent Application Publication No. US2007/0252431 published on Nov. 1, 2007) exemplifies a previously proposed electronic control unit used for, for example, the anti-lock brake system (ABS) of the vehicle and so forth.

The previously proposed electronic control unit described above includes: a liquid pressure control block made of an aluminum alloy material and electrically conducted to a vehicle body; a resin made casing installed at an upper end section of the liquid pressure control block; a cover installed at an upper part of the casing; and a circuit board housed in the casing.

An electrically connecting member is attached onto the casing. One end of this electrically connecting member is connected to a grounding section of the circuit board within the casing and the other end thereof is contacted under pressure onto an upper surface of the liquid pressure control block. This causes an electrical conduction between the liquid pressure control block and the grounding section of the circuit board to provide the same electrical potential for both of the block and the grounding section. Thus, electrical noises of electronic components mounted on the circuit board can be reduced.

SUMMARY OF THE INVENTION

However, in the previously proposed electronic control unit described above, in a case where the cover is made of a metal, the circuit board and the cover are disposed in the proximity to each other. Hence, there is a possibility that electrical noises generated on the circuit board are radiated toward an external side via the cover.

In addition, since the liquid pressure control block is provided with drive actuators such as an electric motor and pressure increasing/decreasing valves. There is a possibility that the electrical noises from these drive actuators and so forth are transmitted onto the cover via the casing so as to be radiated toward an external to the electronic control unit.

It is, therefore, an object of the present invention to provide an electronic control unit which is capable of effectively reducing the electrical noises transmitted from the circuit board or so forth to a cover member.

According to one aspect of the present invention, there is provided with an electronic control unit, comprising: a metallic control block in which a plurality of control equipments are installed; a metallic cover member fitted onto the metallic control block; and an electronic control mechanism retained between the metallic control block and the metallic cover member to drive the control equipments, the electronic control mechanism including: a bus bar constituent made of a resin material and having a power electronic circuit to drive the control equipments; and a print board to control the drive of the control equipments via the bus bar constituent, the print board on which a plurality of electronic parts are mounted being fixed onto the bus bar constituent by means of a metallic fixture section and an electrically conducting section being disposed to electrically conduct the metallic control block to the metallic cover member to provide the same electric potential for both of the metallic cover member and the metallic control block.

According to another aspect of the present invention, there is provided with an electronic control unit, comprising: a metallic control block in which a plurality of control equipments are installed; a metallic cover member fitted onto the metallic control block; and an electronic control mechanism retained between the metallic control block and the metallic cover member to drive the control equipments, the electronic control mechanism including: a bus bar constituent made of a resin material and having a power electronic circuit to drive the control equipments; and a print board to control the drive of the control equipments via the bus bar constituent, the print board on which a plurality of electronic parts are mounted being fixed onto the bus bar constituent by means of a metallic fixture section and an electrically conducting section being disposed to electrically conduct the metallic control block to the metallic cover member via at least one of the fixture section and the bus bar constituent to provide the same electric potential for both of the metallic cover member and the metallic control block.

DETAILED DESCRIPTION OF THE INVENTION

Reference will, hereinafter, be made to the drawings in order to facilitate a better understanding of the present invention. Preferred embodiments in which an electronic control unit according to the present invention is applicable to the ABS will, hereinafter, be described in details on a basis of the accompanied drawings.

First Embodiment

Figure 1:
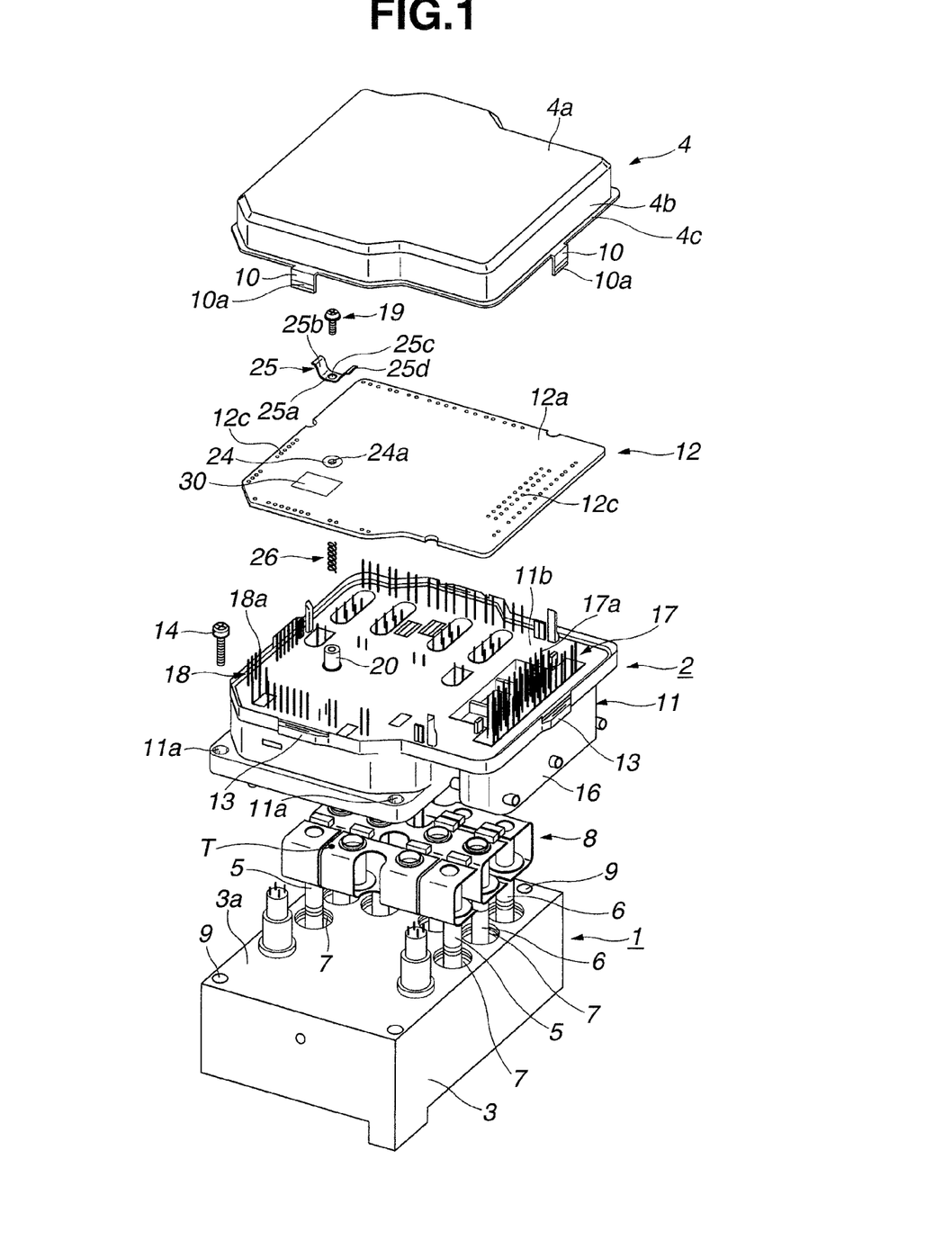
FIG. 1 is an exploded perspective view representing a first preferred embodiment of an electronic control unit according to the present invention.
Figure 2:
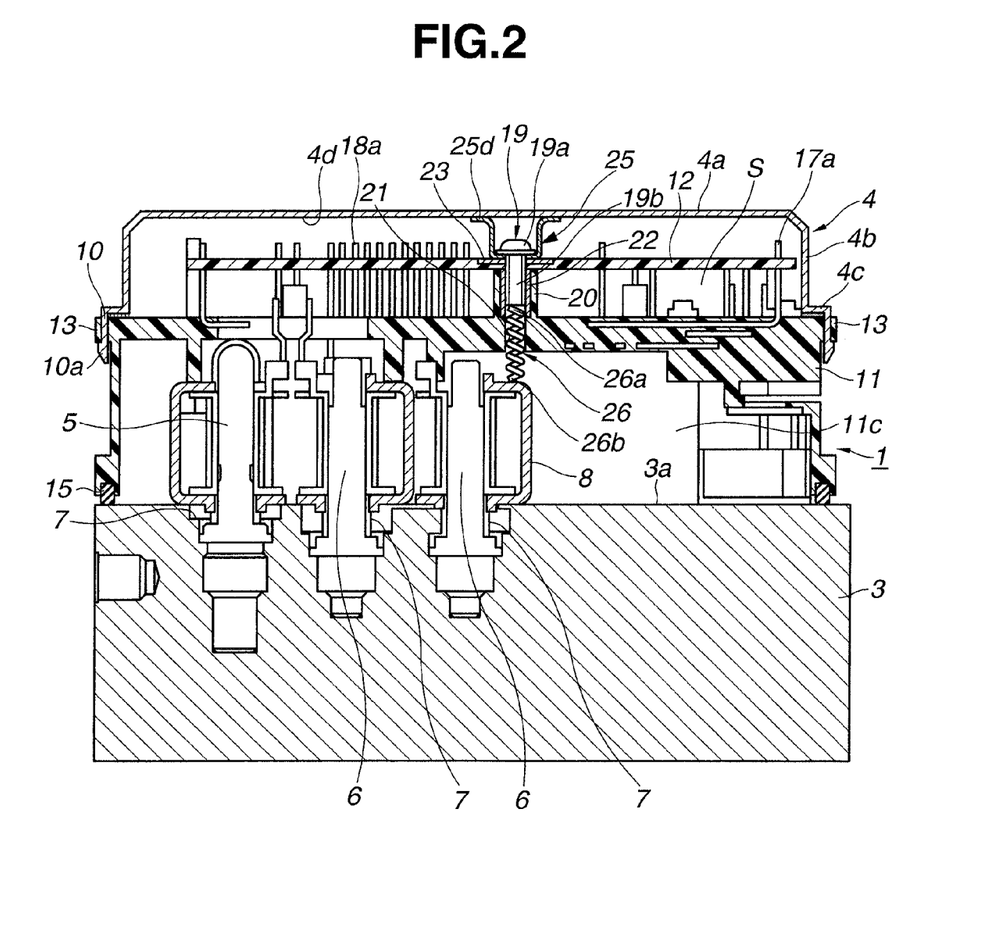
FIG. 2 is a laterally cross sectioned view of the electronic control unit in the first embodiment shown in FIG. 1.
Figure 3:
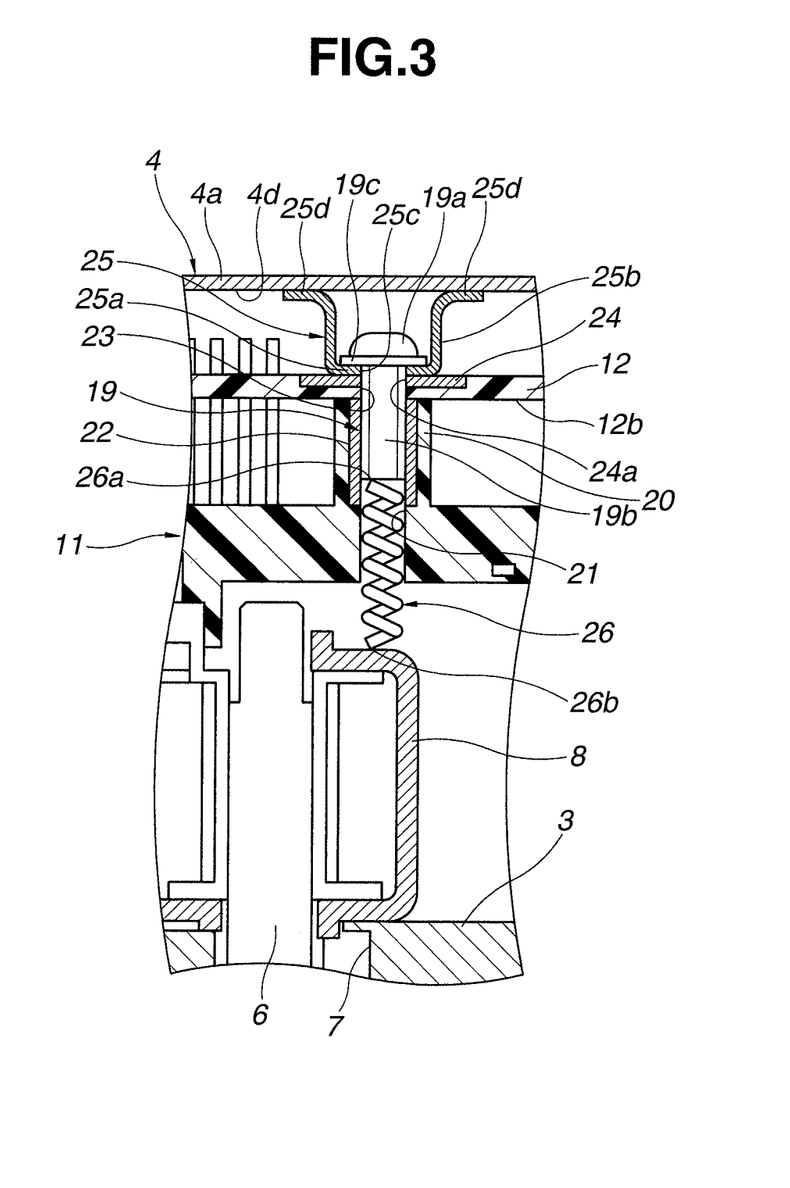
FIG. 3 is an essential part enlarged view of FIG. 2.
Figure 4:
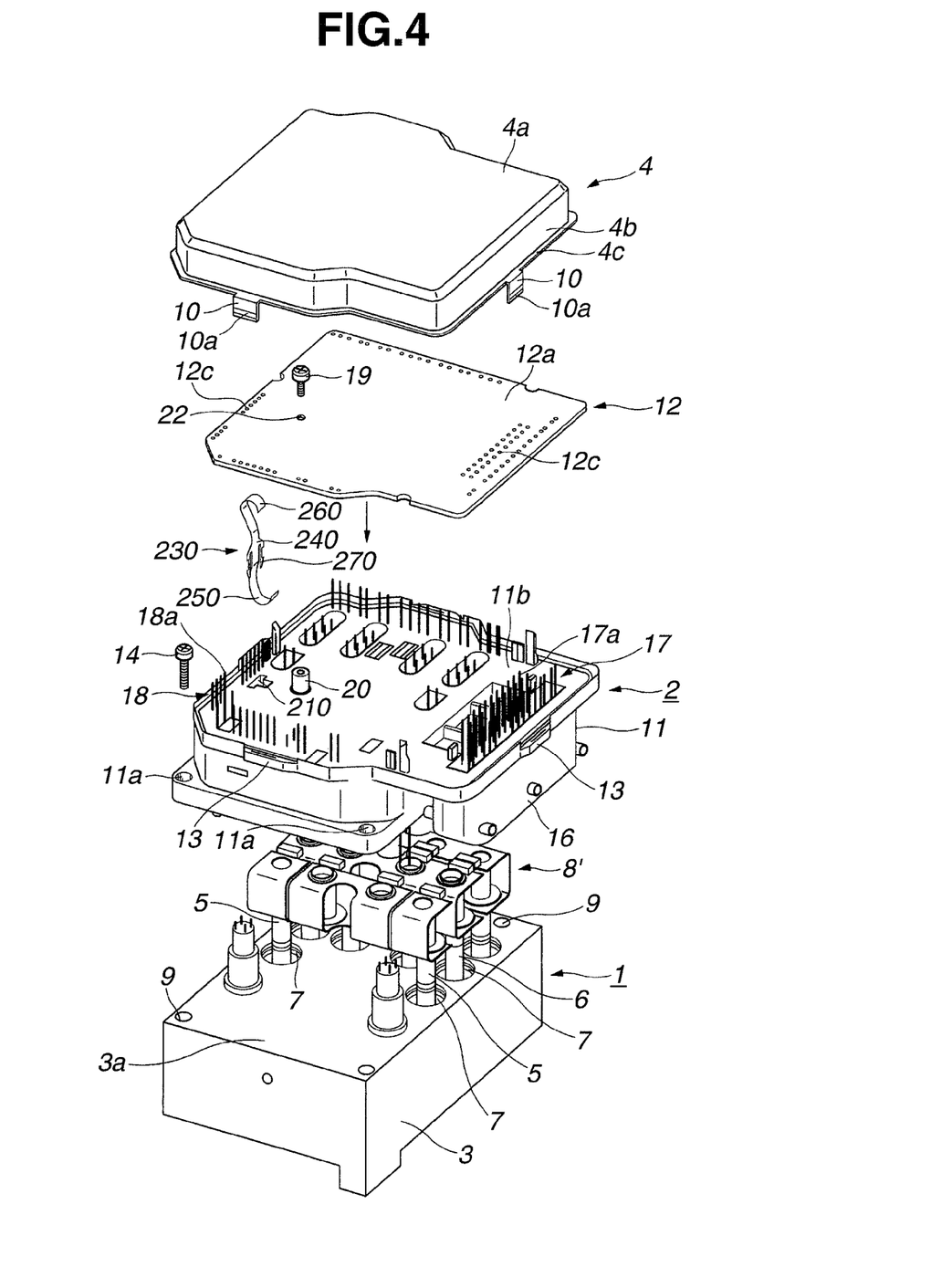
FIG. 4 is an exploded perspective view representing a second preferred embodiment of the electronic control unit according to the present invention.

FIGS. 1, 2, and 3 shows a first preferred embodiment of an electronic control unit which is applicable to an electronic control unit for the ABS (Anti-lock Brake System) of the vehicle.

First, a rough explanation of the ABS will be made below. The ABS includes: a master cylinder generating a brake pressure in accordance with a depression quantity (depth) of a brake pedal (not shown); a main passage configured to communicate the master cylinder with each of wheel cylinders at front left and right road wheels (FL, FR) and rear left and right road wheels (RL, RR); normally open solenoid type pressure increasing valves installed in the main passage and normally close solenoid type pressure decreasing valves installed in the main passage (as will be described later) to control a brake liquid pressure from the master cylinder to each of the wheel cylinders; a pump installed in the main passage to discharge a brake liquid pressure to each of the wheel cylinders; and a reservoir tank configured to reserve the brake liquid exhausted from each wheel cylinder via the corresponding pressure decreasing valve(s) and supply the brake liquid to the main passage according to the operation of the pump.

Each of the pressure increasing valves controls the brake liquid pressure from the master cylinder to be enabled to be supplied to each wheel cylinder and each of the pressure decreasing valves opens the valve thereof when an inner pressure of each of the wheel cylinders is equal to or higher than a predetermined value to generate slips on the corresponding one of the road wheels to return the brake liquid to the reservoir tank.

The above-described pressure increase and decrease are an open-and-closure controlled by means of the electronic control unit in this embodiment so that the brake liquid pressure within each of the wheel cylinders is controlled in a pressure increase mode, a pressure decrease mode, and a pressure holding mode.

The electronic control unit is, as shown in FIGS. 1 and 2, equipped with a casing 1 and an electronic control mechanism 2 retained onto casing 1.

Casing 1 includes: a liquid pressure control block 3 (a metallic control block) located at a lowest side of casing 1 and conducted electrically to a vehicle body; and a cover member 4 fitted onto electronic control mechanism 2 from an upper side of electronic control mechanism 2 assembled on an upper part of liquid pressure control block 3.

Liquid pressure control block 3 is integrally formed substantially in a cubic shape and made of an aluminum alloy material. A plurality of retaining holes 7 through which lower parts of a plurality of pressure increasing valves 5 and pressure decreasing valves 6 are inserted and retained are formed along a vertical direction of this control block 3 and a solenoid casing 8 (coil unit), made of a metal, coupled to upper end sections of respective pressure increasing valves 5 and pressure decreasing valves 6, and into which electromagnetic coils of these valves 5, 6 are housed is retained. A lower surface of this solenoid casing 8 is contacted on an upper surface 3a of liquid pressure control block 3 and electrically conducted thereto.

Liquid pressure units such as the main passage and the sub passages communicated to pressure increasing valves 5 and pressure decreasing valves 6 (these valves constitute a part of the liquid pressure control equipments), a pump to supply a brake liquid pressure to the main passage, and an electric motor to drive the pump are installed within an inside of liquid pressure control block 3. Furthermore, on upper four corner parts of liquid pressure control block 3, female screw holes 9 into which fixture bolts 14 are screwed are formed.

Cover member 4 is formed along an outer shape (profile) of liquid pressure control block 3 in a thin dish shape and is made of an aluminum alloy material. Cover member 4 includes: an upper wall 4a in a flat plate shape; an annular side wall 4b formed integrally on an outer peripheral edge of upper wall 4a; and a rectangular frame shaped flange section 4c continuously integrated onto a lower end outer peripheral portion of side wall 4b.

Above-described flange section 4c is provided with a plurality of retaining pieces 10, each of which retains on an upper end section of an outer periphery of a bus bar constituent 11 in a state in which this cover member 4 is fitted onto a print board 12 as will be described later. These retaining pieces 10 are projected toward a downward direction of cover member 4. Each retaining piece 10 is installed at a substantially center position of each side of flange section 4c. Retaining pawls 10a are respectively formed on tip end outer sides of retaining pieces 10. It should be noted that print board 12 (or called, circuit board) includes a printed circuit board and a printed wiring board and is used in a broad sense of term.

Electronic control mechanism 2 interposed between liquid pressure control block 3 and cover member 4 includes: a power electronic circuit which outputs switching signals on open-and-closure operations to respective pressure increasing and decreasing valves 5, 6 and supplies an electric power to a stator of above-described electric motor; bus bar constituent 11 integrally formed with an electromagnetic filter circuit to reduce radio noises (electromagnetic noises); and print board 12 arranged in an overlapped state on the upper part of bus bar constituent 11 and which is a circuit board to control the drive of the electric motor and so forth.

Bus bar constituent 11 is formed in a block plate shape by means of molding. As shown in FIG. 1, bus bar constituent 11 has the profile formed in substantially rectangular shape along the profile of liquid pressure control block 3 and cover member 4. Four engagement sections 13 which elastically engages with penetrating holes located at insides of retaining pawls 10a of retaining pieces 10 of cover member 4. Furthermore, bolt inserting holes 11a into which fixture bolts 14 are inserted are penetrated in the vertical direction at corners of the outer peripheral part of bus bar constituent 11.

In addition, an annular seal 15 which is elastically contacted on upper surface 3a at the outer peripheral part of liquid pressure control block 3 to seal liquid pressure control block 3 is fixed onto a lower end of the outer peripheral edge of bus bar constituent 11 via a fitting groove formed on bus bar constituent 11, as shown in FIG. 2.

A connector constituent 16 constituted by a power supply connector connected to a battery, a motor connector to supply an electric power to the electric motor, and a signal connector which provides a transmission passage of various kinds of signals such as signals from a resolver, a CAN (Controller Area Network) communication line, and I/O units is integrally installed on a front end section of bus bar constituent 11.

Furthermore, many power distribution patterns such as the power distribution patterns of a power supply negative pole side bus bar connected to the power supply connector, a power supply positive pole side bus bar connected to the power supply connector, a motor output bus bar for motor output, and a power supply positive pole side bus bar are formed on a surface or inner part of bus bar constituent 11.

A plurality of terminal groups 17 connected to the power supply connector, the motor connector, and the signal connector and a plurality of terminal groups 18 for control signals to drive semiconductor switching elements (FET (Field Effect Transistor)) and a motor relay are projected from upper surface 11b of bus bar constituent 11.

In addition, electronic parts of the power electronic circuit, a plurality of aluminum electrolyte capacitors, normal coils, common coils, and a plurality of ceramic capacitors which are components of the filter electronic circuit are mounted on a lower surface 11c of bus bar constituent 11.

Furthermore, a single cylindrical section 20 which fixedly supports print board 12 by means of screw member 19 (which is a metallic fixture section) is integrally extended in the upward direction of bus bar constituent 11 from a predetermined position of upper surface 11b of bus bar constituent 11.

Above-described screw member 19 includes: a head section 19a located at one end side of screw member 19 and on which a cross-shaped groove for a driver jig is formed at an upper surface of head section 19a; and a shank 19b located at the other end side of head member 19, integrally installed on the head section 19a via a flange section 18c provided at a lower surface of head section 19a, and whose outer peripheral side is threaded as a male screw.

Cylindrical section 20 serves to form a gap S having a predetermined width between bus bar constituent 11 and print board 12 and cylindrical section 20 has an axial length such that the electronic parts as will be described later actually mounted on an upper surface of bus bar constituent 11 and a lower surface of print board 12 are not interfered against one another.

In addition, a penetrating hole 21 penetrated continuously through bus bar constituent 11 is formed along the vertical direction of bus bar constituent 11 and a metallic sleeve 22 is integrally fixed on an inner peripheral surface of penetrating hole 21 at cylindrical section 20 side by means of a press fitting or so forth. An inner peripheral surface of this sleeve 22 is formed with the female screw to which the male screw having an outer periphery of shank 19b of screw member 19 is screwed.

Print board 12 is formed substantially in a thin dish plate of a substantially square shape with a synthetic resin material, as shown in FIGS. 2 and 3. A screw inserting hole 23 is penetrated at a position corresponding to cylindrical section 20 of bus bar constituent 11 located at a center of print board 12. A substantially doughnut shaped electrically conducting piece 24 is integrally formed on a hole edge of an upper surface 12a of print board 12 (namely, the hole edge at a side through which screw member 19 is inserted through which screw inserting hole 23). This electrically conducting piece 24 is formed with an inserting hole 24a through which shank 19b of screw member 19 is inserted at the center thereof and flange section 19c of screw member 19 is seated on an exposed upper surface of this electrically conducting piece 24. It should be noted that a reference numeral 25 shown in FIGS. 2 and 3 denotes an earth plate as will be described later.

On this print board 12, a plurality of electronic parts including a microcomputer, for example, a semiconductor switching device (MOS-FET), an acceleration sensor 30, and so forth are actually mounted. In this addition, a power distribution pattern which is a part of a control circuit is formed at an inner part of print board 12. A drive signal to be supplied to the electric motor is produced by means of this print board 12. It should be noted that acceleration sensor 30 is mounted in a proximity to a position of electrically conducting piece 24 at which print board 12 is fixed by means of screw member 19.

Terminal pins 17a and 18a of respective terminal groups 17, 18 of bus bar constituent 11 are inserted into a plurality of terminal holes 12c formed on one side section and formed on the other side section of this print board 12 and connected to corresponding electronic parts by soldering.

Acceleration sensor 30 is of a tuning fork type and a detuning frequency is 500 through 900 Hz. If print board 12 is resonated at the above-described detuning frequency, this acceleration sensor 30 is resonated, an output of acceleration sensor 30 being drifted (offset).

An oscillation frequency of print board 12 can be raised to 1000 Hz through 1300 Hz at a proximity to the fixation section of screw member 19 through print board 12. Therefore, it is advantageous for the drift of the sensor output since this oscillation frequency is not overlapped with the detuning frequency of acceleration sensor 30.

Then, an electrically conducting section which electrically conducts both of liquid pressure control block 3 and cover member 4 via screw member 19 as shown in FIGS. 1, 2, and 3 is interposed between liquid pressure control block 3 and cover member 4.

This electrical conducting section includes: earth plate 25 installed at head section 19a of screw member 19 and elastically contacted on lower surface 4d of upper wall 4a of cover member 4; and an earth spring 26 elastically installed between shank 19b of screw member 19 and solenoid casing 8.

Above-described earth plate 25 is an electrically conductive elongated thin plate folded substantially in a recess form and includes: a flat base section 25a; slanted pieces 25b, 25b which are projected and raised toward a direction at which cover member 4 is faced from both side edges of base section 25a. Base section 25a is provided with an inserting hole 25c through which shank 19b of screw member 19 is inserted at the center thereof and is grasped and fixed between flange section 19c of screw member 19 and conducting piece 24. Upper end sections 25d, 25d of both slanted pieces 25b, 25b are folded toward outer directions and elastically contacted on lower surface 4d of cover member 4.

Earth spring 26 is formed in a coil spring like shape and is made of a metallic member. An upper end section (26a) of earth spring 26 is housed and held within penetrating hole 21 and an upper end edge (26a) of earth spring 26 is elastically contacted on a lower end edge of shank 19b of screw member 19. A lower end edge (26b) of a lower end section (26b) of earth spring 26 projected toward a downward direction of earth spring 26 is elastically contacted on an upper surface (a black point T in FIG. 1) of solenoid casing 8.

(Assembly Procedure)

Hereinafter, an assembly procedure of the electronic control unit in the first embodiment will be explained. First, a liquid pressure unit (or a hydraulic pressure unit) is previously prepared with respective pressure increasing and pressure decreasing valves 5, 6, the pump, the electric motor, and the reservoir previously assembled into liquid pressure control block 3. In addition, the power distribution patterns of the power electronic circuit and the filter electronic circuit are modularized to integrally form bus bar constituent 11 and the plurality of electronic parts such as the electrolyte capacitors and so forth are mounted on bus bar constituent 11. Furthermore, the power distribution patterns of print board 12 and various kinds of electronic parts such as respective semiconductor switching elements are mounted on print board 12.

In addition, earth plate 25 is provisionally attached onto shank 19b of screw member 19 via inserting hole 25c of earth plate 25.

Subsequently, print board 12 is mounted on the upper surface of cylindrical section 20 integrally formed on bus bar constituent 11 with the lower surface of the hole edge of screw inserting hole 23 of print board 12 contacted on the upper surface of cylindrical section 20. At the same time, a positioning is needed to be made for respective terminal pins 17a, 18a corresponding to respective terminal holes 12c and their insertions are needed to be carried out.

Next, in a state in which earth plate 25 is provisionally attached onto bus bar constituent 11, the tip of shank 19b of screw member 19 is inserted into sleeve 22 from bolt inserting hole 24a of electrically conducting piece 24 and screw member 19 is directly and strongly screwed with a predetermined torque via the male and female screws described above.

At this time, base section 25a of earth plate 25 is screwed and fixed in a grasped state between flange section 19c of screw member 19 and electrically conducting piece 24. At the same time, the whole earth spring 26 is compressed and deformed so that upper end edge 26a of earth spring 26 is elastically contacted on the lower end edge of shank 19b and lower end edge 26b of earth spring 26 is elastically contacted on the upper surface of solenoid casing 8.

Consequently, print board 12 is fixed to an upper position of bus bar constituent 11 and an electrical conductivity between print board 12 and solenoid casing 8 is secured.

Thereafter, respective terminal pins 17a, 18a are soldered to print board 12 in a state in which terminal pins 17a, 18a are inserted into respective terminal holes 12c. Thus, print board 12 and electronic parts connected to terminal pins 17a, 18a are mutually connected to each other.

Next, after an adhesive is applied to the outer periphery of cover member 4, cover member 4 is fitted from above onto print board 12 and bus bar constituent 11 and each retaining pawl 10a of the corresponding one of retaining pieces 10 is engageably inserted into the corresponding retaining hole of each retaining section 13 of bus bar constituent 11 utilizing an elastic deformation. Thus, by retaining each retaining pawl 10a into lower hole edge of the corresponding retaining hole, cover member 4 can easily be assembled onto bus bar constituent 11.

Subsequently, bus bar constituent 11 is positioned and provisionally mounted on upper surface 3a of liquid pressure control block 3 via annular seal 15. Thereafter, each fixture bolt 14 is tightened to fix bus bar constituent 11 onto liquid pressure control block 3. Thereafter, earth spring 26 is previously inserted into penetrating hole 21 of bus bar constituent 11. Lower end edge 26b is contacted on the upper surface of solenoid casing 8. Thus, an assembly work of each component described above is completed.

At this time, the upper surfaces of both upper end sections 25d, 25d of earth plate 25 are elastically contacted on lower surface 4d of upper wall 4a of cover member 4 according to the elastic force exerted by earth plate 25 itself. Base section 25a of earth plate 25 is grasped between head section 19a of screw member 19 and print board 12 and is electrically conducted to screw member 19 and print board 12. Head section 19a of screw member 19 is elastically contacted on earth spring 26 and is electrically conducted to a shoulder section of solenoid casing 8. Furthermore, since solder casing 8 is electrically contacted on liquid pressure control block 3. Thus, the electrical conductivity between cover member 4 and liquid pressure control block 3 is secured.

As described above, in the first embodiment, liquid pressure control block 3 and cover member 4 are electrically conducted by means of spring member 19, earth plate 25, and earth spring 26 so that both of liquid pressure control block 3 and cover member 4 can provide the same potential. Therefore, the electrical noise transmitted from print board 12 to cover member 4 and a magnetic field variation due to a variation (switching) in the drive current of the electric motor or the valve solenoids can cause the electrical noise generated on a current line of the motor or solenoid as the noise to flow toward liquid pressure control block 3, namely, a vehicle body. Thus, the electrical noise on cover member 4 can effectively be reduced. Hence, noise superpositions on signal lines installed on print board 12 can be suppressed.

In addition, since the electrical noise generated on print board 12 via electrically conducting piece 24 can directly be transmitted to liquid pressure control block 3, the electrical noise generated on print board 12 can effectively be reduced.

In addition, since the electrical noise transmitted from the external to cover member 4 can be caused to flow on the liquid pressure control block 3, the noise transmission to print board 12 can sufficiently be suppressed.

Furthermore, since acceleration sensor 30 mounted on print board 12 is disposed in the proximity to the fixation position of screw member 19. Therefore, since the vibration transmission to acceleration sensor 30 can effectively be blocked, the reduction in the acceleration detection accuracy can be suppressed.

In addition, the electrical conductivity between both of liquid pressure control block 3 and cover member 4 is secured utilizing readily available screw member 19. Hence, the reduction in a manufacturing cost can be achieved.

That is to say, with earth plate 25 fixed onto print board 12 by means of a (screw or tightening) torque of screw member 19 and earth spring 26 is elastically contacted on solenoid casing 8 utilizing a screw tightening force of screw member 19. Hence, as compared with a case where another earth connecting member is formed and fixed onto the bus bar constituent, the structure can be simplified and the manufacturing work can be facilitated.

In addition, lower end edge 26b of earth spring 26 is elastically contacted on readily available solenoid casing 8 without direct elastic contact on liquid pressure control block 3. Thus, an axial length of earth spring 26 can sufficiently be shortened. Thus, as described above, when a compression force is given to earth spring 26 with screw member 19 tightened, an unintentional fall in a radial direction of earth spring 26 and a twisted deformation does not occur. Thus, it becomes possible to always maintain a linearity. Hence, a stable elastic contact action for solenoid casing 8 can be obtained.

Furthermore, a mere tightening of screw member 19 onto continuous holes 22, 23 can simultaneously achieve the fixation of earth plate 25 on print board 12 and an elastic contact force of earth spring 26. Hence, the assembly operation for these parts can become facilitated.

Furthermore, cover member 4, print board 1, and solenoid casing 8 are always electrically contacted on one another according to earth plate 25 and a spring force of earth spring 26 via spring force 19. Hence, even if a vibration is developed, the electrical conductivity between liquid pressure control block 3 and cover member 4 can always stably be maintained.

Especially, earth plate 25 is elastically contacted against lower surface 4d of upper wall of cover member 4 and earth spring 26 is elastically contacted on solenoid casing 8, respectively. Hence, a degree of freedom in the length of the whole conducting section including screw member 19 is increased.

Consequently, even if a dimensional error and an assemble error in the vertical direction of each of liquid pressure control block 3, cover member 4, and bus bar constituent 11 are developed, a deflective deformation (deflection) in a length direction of each of earth plate 25 and earth spring 26 can absorb each of the errors described above. Hence, the positioning and the assembly work can be facilitated.

In addition, since earth plate 25 and earth spring 26 are arranged at each dead space of the upper part of the screw member 19 and lower part of screw member 19, an effective utilization of these dead spaces can be achieved. Consequently, a large sizing of the unit and a modification of a circuit component arrangement can be suppressed.

Furthermore, in this embodiment, the power distribution pattern of the power electronic circuit and the filter electronic circuit and so forth are integrally modularized to constitute thin bus bar constituent 11. Hence, it becomes possible to reduce a height of the electronic control unit in the vertical direction of the electronic control unit. The small sizing of the whole unit (or thinning) can be achieved and a light weighting can also be achieved.

In addition, in this embodiment, cover member 4 can be united to bus bar constituent 11 with a mere one-touch operation utilizing each retaining piece 11 and each retaining section 13. Hence, the assemble work of this cover member 4 becomes preferable.

The present invention is not limited to the structure of the preferred embodiment. Earth plate 25 and earth spring 26 are not electrically conducted to each other via the screw member 19 but, for example, a cylindrically shaped electrically conducting material is fitted onto the outer periphery of shank 19b of screw member 19 so that both of earth plate 25 and earth spring 26 may be conducted via this electrically conducting material.

In addition, as the fixture section described above, the fixture section may be constituted not only by a bolt-and-nut structure but also by a rivet having the electrically conductivity.

Furthermore, earth plate 25 may be constituted by only single slant piece 25b projected at one side of base section 25a. In addition, it is, for example, possible to arbitrarily modify the shape and structure of casing 1 and bus bar constituent 11.

Furthermore, as an applicable unit of the electronic control unit according to the present invention, the present invention is applicable to a traction control system (TCS) in addition to the ABS described above.

Second Embodiment

The electronic control unit in a second preferred embodiment according to the present invention will hereinafter be made with reference to the attached drawings of FIGS. 4 through 7.

It should be noted that the parts having the same reference numerals in the second embodiment designate like elements in the first embodiment but difference points from the first embodiment will be described below.

The electronic control unit is applicable to the ABS in the same way as the first embodiment. In the ABS, respective pressure increasing or decreasing valves are power supplied to turn on and not power supplied to turn off on a basis of a control signal from the electronic control unit.

It should be noted that solenoid casing 8 in the first embodiment generally corresponds to a coil unit 8' in the second embodiment. In an inner part of liquid pressure control block 3, the plunger pump is installed. However, in place of the plunger pump, a reversible gear pump can be used. Cover member 4 is made of aluminum alloy material functioning as a heat sink and is formed along the profile of liquid pressure control block 3. Print board 12 is arranged on the upper part of bus bar constituent 11.

Furthermore, single cylindrical body 20 is integrally installed to fix and support by means of print board 12 through screw member 19 at the predetermined position of upper surface 11b of bus bar constituent 11. On an inner peripheral surface of cylindrical section 20, a metallic cylindrical envelope section 20a is integrally fixed and a female screw section to which screw 19 is screwed is formed on the inner peripheral surface of cylindrical; envelope section 20a.

In addition, as shown in FIGS. 4 through 7, a penetrating hole 210 which is penetrated in the vertical direction is formed in the proximity to cylindrical section 20 of bus bar constituent 11. This penetrating hole 210 is formed in a substantially plane surface view of a letter T shape and is constituted by an inserting hole section 210a formed in substantially an rectangular shape; and an escaping hole 210b located at the substantially rectangular shape and located at substantially center position at one side of inserting hole section 210a.

Print board 12 is formed in a thin plate of an approximately square shape made of the synthetic resin and screw inserting hole 22 is penetrated at a predetermined position corresponding to cylindrical member 20 of bus bar constituent 11. In addition, when print board 12 is mounted from the above side of bus bar constituent 11, a lower surface side hole edge of screw inserting hole 22 is contacted on the upper surface of cylindrical section 20. Thus, the electronic parts are not interfered against one another according to a presence of gap C (refer to FIG. 5).

Then, in the second embodiment, an earth connecting member 230 which is the electrically connecting member is fixedly fitted into penetrating hole 210 of bus bar constituent 11.

Figure 5:
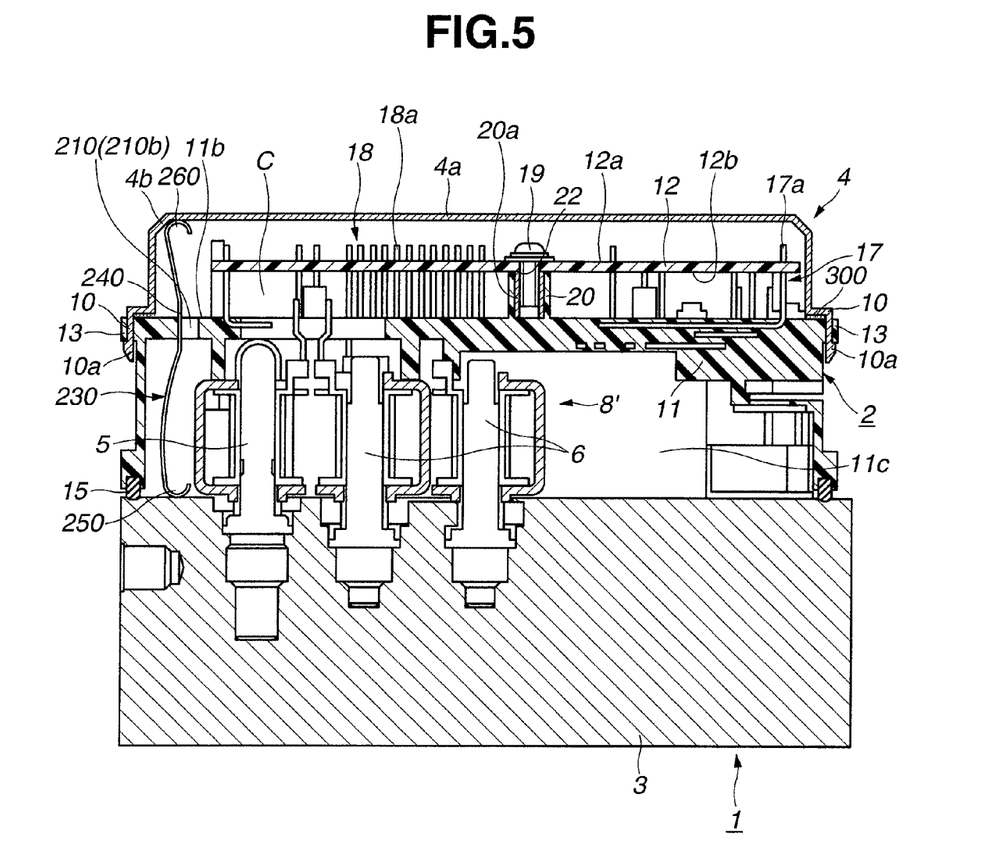
FIG. 5 is an essential part expanded cross sectioned view of the electronic control unit in the second embodiment according to the present invention shown in FIG. 4.
Figure 6:
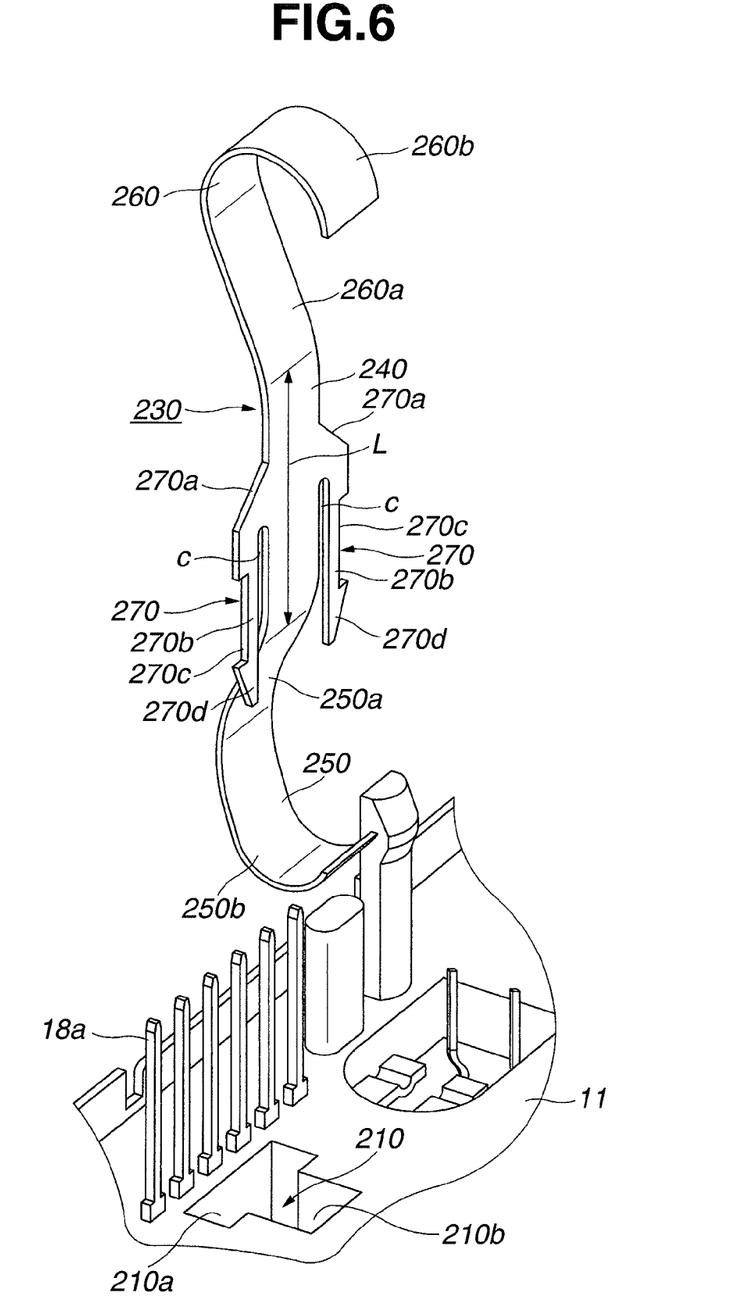
FIG. 6 is a perspective view for explaining a grounding (earth) connecting member and a corresponding penetrating hole through which the earth connecting member is inserted to be applied in the second embodiment shown in FIGS. 3 and 4.
Figure 7:
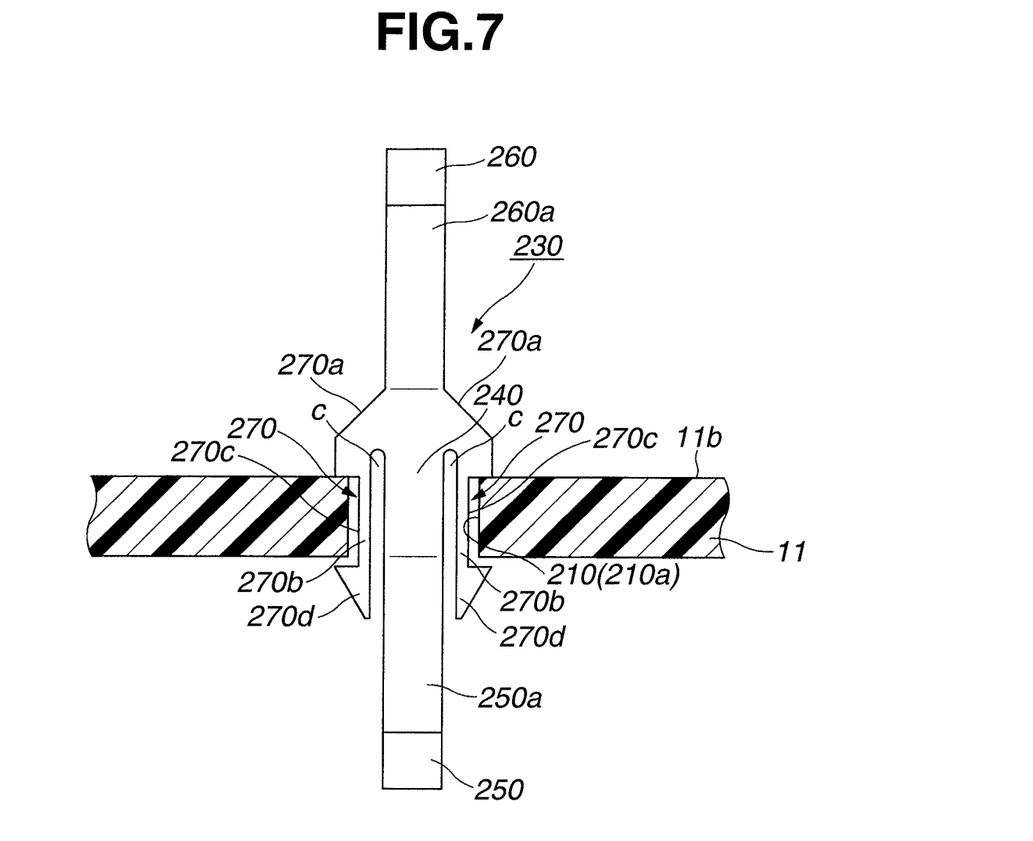
FIG. 7 is an enlarged cross sectional view for explaining a state in which the earth connecting member is retained into the penetrating hole shown in FIG. 6.

This whole earth connecting member 230 is, as shown in FIG. 6, integrally formed in a flat plate shape made of an electrically conductive member such as copper and includes: a base section 240 in a rectangular shape positioned at penetrating hole 210; elastic deformation sections 250, 260 which are both end sections extended in the vertical direction from upper and lower end edges of base section 240; and a pair of left and right clip pieces 270, 270 which are retaining sections installed on both end sections of base section 240. In addition, earth connecting member 230 has, as shown in FIG. 5, the whole length set so as to be longer than the straight distance between upper surface 3a of liquid pressure control block 3 and lower surface 4c of upper wall 4a of cover member 4, when cover member 4 is assembled onto liquid pressure control block 3 via bus bar constituent 11.

Base section 240 is formed in the flat plate shape and has a vertical length L which is slightly longer than the vertical length of inserting hole section 210a of penetrating hole 210.

Both of elastic deformation members 250, 260 are constituted by extended sections 250a, 260a extended in the vertical direction from upper and lower ends of base section 240 and folded in curved shapes toward respective outer sides of base section 240; and contacting sections 250b, 260b integrally formed on tips of respective extended sections 250a, 260a and having tip sections folded in the curved shape mutually toward inner sides of base section 240. Outer surfaces of respective contacting sections 250a, 260b are elastically contacted on upper surface 3a of liquid pressure control block 3 and lower surface 4c of upper wall 4a of cover member 4.

Each clip piece 270, 270 is constituted by a shoulder section 270a, 270a integrally installed on base section 240 in a lateral direction from a substantially center position of base section 240; and leg pieces 270b, 270b extended toward the lower direction of earth connecting member 230 with constant spatial intervals of c, c. An upper end edge of each shoulder section 270a, 270a is slanted in the downward direction as shown in FIG. 6. A retaining groove 270c, 270c is formed at each of both sides of respective leg pieces 270b, 270b having a slightly larger size than a wall thickness of the upper wall of bus bar constituent 11 and retaining groove sections 270d, 270d which are retained on lower part hole edges of inserting hole sections 210a of penetrating hole 210.

[Assembly Procedure]

Hereinafter, the assemble procedure of the electronic control unit in the second embodiment described above will be described below. Each pressure increasing valve 5, each pressure decreasing valve 6, the plunger pump, the electric motor, the reservoir tank, and so forth are previously assembled on liquid pressure control block 3 to constitute the liquid pressure unit (the hydraulic pressure unit). In addition, the power distribution patterns of the power electronic circuit and the filter electronic circuit are modularized to form integrally bus bar constituent 11 and the plurality of electronic parts are mounted on bus bar constituent 11. Furthermore, the power distribution patterns of print board 12 and various kinds of electronic parts such as respective semiconductor switching elements are mounted.

On the other hand, earth connecting member 23 is retained and fixed onto penetrating hole 21 of bus bar constituent 11. That is to say, as shown in FIG. 6, earth connecting member 230 is carried such that base section 240 side is faced toward inserting hole section 210*a* and is inserted directly through penetrating hole 210 from above. At this time, lower elastic deformation section 250 is inserted through both of insertion purpose hole section 210*a* and escaping purpose hole section 210*b* of penetrating hole 210. When this deformation section 250 is continued to be pushed, retaining pawls 270*d*, 270*d* of respective clip pieces 270, 270 are elastically deformed and mutually inserted into the mutually opposing inside parts of inserting hole section 210*a* via respective gaps c, c elastically contacting retaining pawls 270*d*, 270*d* of both clip pieces 270, 270 on the upper end edge and the inner surface opposing against hole 210*a*. When the upper and lower end edges of respective retaining grooves 270*c*, 270*c* are positioned at inserting hole sections 210*a*, both of clip pieces 270, 270 are elastically recovered and respective retraining grooves 270*c*, 270*c* are retained on upper and lower opening edges of inserting hole section 210*a*.

Thus, earth connecting member 230 is firmly retained and fixed onto bus bar constituent 11 with a mere one-touch operation.

Subsequently, print board 12 is mounted on the upper surface of cylindrical section 20 of bus bar constituent 11 while print board 12 is contacted on the lower surface hole edge of screw inserting hole 22. At the same time, each terminal pin 17*a*, 18*a* corresponding to each terminal hole 12*c* is positioned and inserted into each terminal hole 12*c*.

Thereafter, screw 19 is screwed onto the female screw section of cylindrical section 20*a* from screw inserting hole 22 to fix print board 12 onto the upper position of bus bar constituent 11. Thereafter, each terminal pin 17*a*, 18*a* is soldered onto print board 12 in the state in which each terminal pin 17*a*, 18*a* is inserted into each terminal hole 12*c*. Thus, mutual interconnections between terminal pins and holes of print board 12 can be made.

Next, as shown in FIG. 5, an adhesive 300 is coated on an outer periphery of cover member 4. Thereafter, print board 12 is fitted into bus bar constituent 11 from above and each retaining pawl 10*a* of each retaining piece 10 is inserted into the retaining hole of each retaining section 13 of bus bar constituent 11 utilizing the elastic deformation. At this time, each retaining pawl 10*a* is retained on the lower section hole edge of the corresponding retaining hole. Thus, print board 12 can easily be assembled onto bus bar constituent 11.

Next, after bus bar constituent 11 is provisionally mounted by positioning bus bar constituent 11 on the upper surface of liquid pressure control block 3 via annular seal 15, each fixture bolt 14 is used to fix bus bar constituent onto liquid pressure control block 3. At this time, the lower end outer surface of curved section 250*b* of elastic deformation section 250 located at a lower side of earth connecting member 230 is elastically contacted on upper surface 3*a* of liquid pressure control block 3. Thus, the assembly operation of each component is completed.

At this time, the upper surface of curved section 260*b* of elastic deformation section 260 of earth connecting member 230 is elastically contacted on lower surface 4*c* of upper wall 4*a* of cover member 4.

As described above, in the second embodiment, earth connecting member 230 is used to electrically conduct liquid pressure control block 3 to cover member 4. Thus, both of liquid pressure control block 3 and cover member 4 are electrically at the same potential. Thus, since the electrical noise transmitted from circuit board 12 to cover member 4 can be caused to flow to liquid pressure control block 3 side. Hence, the electrical noise on cover member 4 can effectively be reduced.

In addition, earth connecting member 23 is always elastically contacted on both of upper surface 3*a* of liquid pressure control block 3 and lower surface 4*c* of the upper wall of cover member 4 according to the elastic deformation of respective elastic deformation sections 250, 260. Hence, even if the vibration is developed, the electrical conductivity between liquid pressure control block 3 and cover member 4 can, always, stably be maintained.

Especially, since both of elastic deformation sections 250, 260 are formed in the curved shape, the degree of freedom of the whole length of earth connecting member 230 can be improved.

Consequently, even if the vertical dimensional error and assembly error of liquid pressure control block 3, cover member 4, and bus bar constituent 11 are generated, the large twist deformation in the elongated direction according to the curved shape of each elastic deformation section 250, 260 can be made so that each error described above can be absorbed. Thus, the positioning work and assemble operation are possible.

Furthermore, earth connecting member 230 can be retained and fixed strongly on penetrating hole 210 of bus bar constituent 11 and, as described hereinabove, earth connecting member 230 can be retained and fixed. Thus, this fixation work can extremely be facilitated.

In addition, since earth connecting member 230 is arranged at a dead space within liquid pressure control block 3, cover member 4, and bus bar constituent 11, an effective utilization of the dead space can be made. The other advantages in the case of the second embodiment are the same as those in the case of the first embodiment.

The present invention is not limited to the preferred embodiments. For example, it is possible to connect earth connecting member 230 to liquid pressure control block 3 via cover member 4 and print board 12. According to this, the electrical noise generated on print board 12 can directly be transmitted to liquid pressure control block 3.

Furthermore, for example, it is possible to arbitrarily modify the shapes and structures of casing 1 and bus bar constituent 11. In addition, as described above, the object to be applied includes an electronic control unit of the traction control system (TCS) in addition to the ABS. Furthermore, elastic deformation sections 250, 260 may be installed on only one end section of earth connecting member 230.

It should be noted that a hydraulic pressure circuit including, the electric motor, the pressure decreasing and increasing valves, the master cylinder, the reservoir, the master cylinder, and the respective wheel cylinders described above is exemplified by a United States Patent Application Publication No. 2007/0252431 published on Nov. 1, 2007, a U.S. Pat. No. 7,997,665 issued on Aug. 16, 2011, and a U.S. Pat. No. 7,290,840 issued on Nov. 6, 2007 (which are herein incorporated by reference).

Technical ideas grasped by the present invention will be described hereinbelow.

(1) The electronic control unit as claimed in claim 3, wherein the fixture section is constituted by a screw member, a screw penetrating hole through which the screw member is inserted is penetrated on a predetermined position of the print board, an electrically conductive piece is disposed on a hole edge of the screw penetrating hole at a screw inserting side of the screw penetrating hole, and the earth plate is fixedly grasped between the electrically conductive piece and a head section of the screw member.

(2) The electronic control unit as claimed in claim 3, wherein the earth plate includes: a flat base piece fixed to the fixture section; and slanted pieces projected from both ends of the base piece toward the cover member, the slanted pieces being formed in a recess shape together with the base piece, each upper end of the slanted pieces being bent toward an outer direction from the recess shaped base piece and slanted pieces to elastically bring an upper surface of each upper end of the slanted pieces into contact with the lower surface of the cover member.

(3) The electronic control unit as claimed in claim 5, wherein a cylindrical section is integrally formed on an upper surface of the bus bar constituent and a metallic sleeve is integrally fixed onto an inner periphery of the cylindrical section, a female screw being formed on the metallic sleeve and on which the screw member is screwed.

(4) The electronic control unit as claimed in claim 5, wherein one end of the earth spring is elastically contacted on a tip edge of a shank of the screw member and the other end of the earth spring is elastically contacted on an upper surface of the solenoid casing.

(5) The electronic control unit as claimed in claim 10, wherein the earth connecting member is formed in a rectangular plate shape and the elastic deformation section of the earth connecting member is bent to form a curve. Since the elastic deformation section is formed in the curved shape (as described in item (5)), the length of the electric connecting member is improved and the electrical connection state can always be assured even if the length between the liquid pressure control block and the cover member is modified.

(6) The electronic control unit as claimed in claim 11, wherein the retaining sections comprise: a plate-formed base section formed at a center of the earth connecting member; and a pair of retaining pieces disposed in parallel to each other at both sides of the base section and which are elastically deformable toward mutually inner directions, retaining grooves which retains on the hole edge of the penetrating hole being formed on an outer edge of each of the retaining pieces.

(7) The electronic control unit as claimed in claim 10, wherein the elastic deformation section is formed on each of both ends of the earth connecting member. According to the present invention described in item (7), the elastic deformation sections are formed on both ends of the electrical connecting member, respectively. When the electrical connecting member is attached onto the bus bar constituent, the respective elastic deformation members absorb the assembly error of attaching the electrical connecting member onto the bus bar constituent. Thus, the assembly operation becomes facilitated.

This application is based on prior Japanese Patent Applications No. 2011-170613 filed in Japan on Aug. 4, 2011 and No. 2011-170614 filed in Japan on Aug. 4, 2011. The entire contents of this Japanese Patent Application No. 2011-170613 and No. 2011-170614 are hereby incorporated by reference. Although the invention has been described above by reference to certain embodiments of the invention, the invention is not limited to the embodiment described above. Modifications and variations of the embodiments described above will occur to those skilled in the art in light of the above teachings. The scope of the invention is defined with reference to the following claims.

What is claimed is:

1. An electronic control unit, comprising:
a metallic control block in which a plurality of control equipments are installed;
a metallic cover member fitted onto the metallic control block; and
an electronic control mechanism retained between the metallic control block and the metallic cover member to drive the control equipments, the electronic control mechanism including: a bus bar constituent made of a resin material and having a power electronic circuit to drive the control equipments; and a print board to control the drive of the control equipments via the bus bar constituent, the print board on which a plurality of electronic parts are mounted being fixed onto the bus bar constituent by means of a metallic fixture section and an electrically conducting section being disposed to electrically conduct the metallic control block to the metallic cover member to provide the same electric potential for both of the metallic cover member and the metallic control block, wherein
the electrically conducting section electronically conducts the metallic cover member to the metallic control block via the fixture section, and
the electrically conducting section includes: an earth plate made of an electrically conductive material and which includes a base section fixed to one end of the fixture section and a tip section elastically contacted on a lower surface of the cover member; and an earth spring made of the electrically conductive material, one end of the earth spring being elastically contacted on the other end of the fixture section and the other end of the earth spring being elastically contacted on the control block via the control equipments.

2. The electronic control unit as claimed in claim 1, wherein the control equipments include a plurality of valve mechanisms configured to perform a pressure increase or a pressure decrease of a brake liquid pressure and the other end of the earth spring is elastically contacted on a metallic solenoid casing constituting each valve mechanism to electrically conduct the metallic cover member to the metallic control block.

3. The electronic control unit as claimed in claim 1, wherein the fixture section is constituted by a screw member, a screw penetrating hole through which the screw member is inserted is penetrated on a predetermined position of the print board, an electrically conductive piece is disposed on a hole edge of the screw penetrating hole at a screw inserting side of the screw penetrating hole, and the earth plate is fixedly grasped between the electrically conductive piece and a head section of the screw member.

4. The electronic control unit as claimed in claim 1, wherein the earth plate includes: the base section fixed to the fixture section; and slanted pieces projected from both ends of the base section toward the cover member, the slanted pieces being formed in a recess shape together with the base section, each tip section of the slanted pieces being bent toward an outer direction from the recess shaped base section and slanted pieces to elastically bring an upper surface of each tip section of the slanted pieces into contact with the lower surface of the cover member.

5. The electronic control unit as claimed in claim 3, wherein a cylindrical section is integrally formed on an upper surface of the bus bar constituent and a metallic sleeve is integrally fixed onto an inner periphery of the cylindrical section, a female screw being formed on the metallic sleeve and on which the screw member is screwed.

6. The electronic control unit as claimed in claim 3, wherein one end of the earth spring is elastically contacted on a tip edge of a shank of the screw member and the other end of the earth spring is elastically contacted on an upper surface of a solenoid casing of the control equipments.

7. The electronic control unit as claimed in claim 1, wherein the control equipments are a brake liquid pressure control equipments and the metallic control block is connected to a body of a vehicle.

\* \* \* \* \*